US009838800B2

(12) United States Patent
West et al.

(10) Patent No.: US 9,838,800 B2
(45) Date of Patent: Dec. 5, 2017

(54) PBLG BASED PLANAR MICROPHONES

(71) Applicant: The Johns Hopkins University, Baltimore, MD (US)

(72) Inventors: James E. West, Baltimore, MD (US); Kailiang Ren, Baltimore, MD (US); Michael Yu, Timonium, MD (US)

(73) Assignee: The Johns Hopkins Univeristy, Baltimore, MD (US)

( * ) Notice: Subject to any disclaimer, the term of this patent is extended or adjusted under 35 U.S.C. 154(b) by 0 days.

(21) Appl. No.: 14/603,992

(22) Filed: Jan. 23, 2015

(65) Prior Publication Data

US 2015/0215707 A1 Jul. 30, 2015

Related U.S. Application Data

(60) Provisional application No. 61/931,267, filed on Jan. 24, 2014.

(51) Int. Cl.

*H04R 25/00* (2006.01)
*H04R 17/02* (2006.01)
*H04R 1/44* (2006.01)
*H01L 41/00* (2013.01)

(52) U.S. Cl.

CPC ............. *H04R 17/025* (2013.01); *H04R 1/44* (2013.01); *H01L 41/00* (2013.01)

(58) Field of Classification Search

CPC .......... H04R 17/025; H04R 1/44; H01L 41/00
USPC ......... 381/173, 355, 369; 367/174, 168, 176
See application file for complete search history.

(56) References Cited

U.S. PATENT DOCUMENTS 4,907,207 A * 3/1990 Moeckl .................. G10K 13/00 181/170
2010/0230629 A1* 9/2010 Yu ......................... H01L 41/183 252/62.9 R

FOREIGN PATENT DOCUMENTS

KR 1020100043392 * 11/2011

* cited by examiner

*Primary Examiner* — Sunita Joshi

(74) *Attorney, Agent, or Firm* — Mintz Levin Cohn Ferris Glovsky and Popeo, P.C.; Peter F. Corless

(57) ABSTRACT

A piezoelectric, poly (γ-benzyl-α,L-glutamate) ("PBLG") planar microphone, and method for construction thereof, are disclosed. The microphone includes at least a polyester film, a piezoelectric, hot pressed poly (γ-benzyl-α,L-glutamate) ("HPPBLG") layer, and an aluminum coating for the HPPBLG layer. The coated HPPBLG layer is coupled to the polyester film.

30 Claims, 4 Drawing Sheets

PBLG BASED PLANAR MICROPHONES

CROSS-REFERENCE TO RELATED APPLICATION

This application claims priority to and the benefit of U.S. Provisional Patent Application No. 61/931,267 filed in the United States Patent and Trademark Office on Jan. 24, 2014, the entire contents of which are incorporated herein by reference.

BACKGROUND (a) Technical Field

The present disclosure relates to a planar microphone that is based on piezoelectric, electrospun poly (γ-benzyl-α,L-glutamate) ("PBLG") nanofibers.

(b) Background Art

Since the first piezoelectric crystal microphone developed by A. Nicolson using Rochelle salt in 1919, piezoelectric materials have been widely used in various transducers. Low sensitivity and inconsistent frequency characteristics have traditionally limited the commercial use of such transducers for airborne sound. However, piezoelectric materials have found some use in underwater sound applications because these types of materials can operate over a wide range of static pressure.

Although the piezoelectric property of poly(vinylidene fluoride) (PVDF) first reported in 1969 stimulated interests in its use for transducers having a broad frequency range, low depolarization temperature (80° C.) limited its widespread use, while attempts to increase the depolarization temperature were met with only moderate improvements. In 1996, space charged low density polypropylene (LDPP) electrets were developed which exhibited large piezoelectric coefficient (>150 pC/N) equaling those in crystalline and ceramic materials. The mechanical properties and polarization of LDPP electrets have been extensively studied for applications in flexible field effect transistors, and ferroelectret accelerometers. Because fabrication of piezoelectric LDPP is relatively simple, it was once thought that this material could replace the crystal and ceramic materials used in microphones. However, the depolarization temperature (60° C.) of this material turned out to be even lower than that of PVDF and therefore could only be used under limited environmental conditions. Thus, there has been a long-standing need for improved piezoelectric materials that can be made into simple transducers and are also capable of working at high temperatures.

SUMMARY OF THE DISCLOSURE

The present disclosure generally provides a planar microphone that uses one or more layers of piezoelectric, electrospun PBLG fibers to detect an audio signal. In particular, the present disclosure includes techniques that allow for the construction of a PBLG-based microphone having improved characteristics.

In one aspect, the present disclosure provides a planar microphone comprising. The microphone includes a polyester film. The microphone also includes a piezoelectric PBLG layer. The microphone further includes an aluminum coating for the PBLG layer. The coated PBLG layer is coupled to the polyester film.

In another aspect, a method of manufacturing a planar microphone is disclosed herein. The method includes fabricating a film of PBLG fibers that are directionally aligned.

The method also includes applying a hot press to the film of PBLG fibers. The method further includes cutting the hot pressed film of PBLG fibers at an angle of approximately 45° relative to the direction of alignment of the PBLG fibers. The method additionally includes coating the cut film of PBLG fibers with aluminum. The method further includes adhering the aluminum coated film of PBLG fibers to a polyester film.

In a further aspect, a method of manufacturing a planar microphone is disclosed that includes fabricating films of directionally aligned PBLG fibers. A hot press is applied to the films of PBLG fibers to form hot pressed PBLG ("HPPBLG") films. A first layer of HPPBLG film is oriented at approximately ninety degrees relative to a second layer of HPPBLG film.

In yet another aspect of the present disclosure, a sensor is disclosed. The sensor includes a cylindrical chamber. The sensor also includes an aluminum coated, piezoelectric poly (γ-benzyl-α,L-glutamate) ("PBLG") layer mounted within the cylindrical chamber.

BRIEF DESCRIPTION OF THE DRAWINGS

The above and other features of the present invention will now be described in detail with reference to certain exemplary embodiments thereof illustrated the accompanying drawings which are given herein below by way of illustration only, and thus are not limitative of the present invention, and wherein.

Figure 1A:
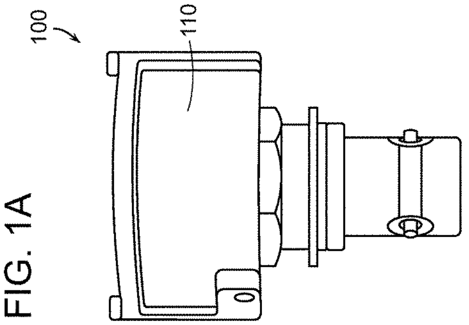
FIG. 1A is a side view of a sensor that includes a PBLG-based microphone.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

The present disclosure relates, at least in part, to a PBLG microphone having improved thermal and sensitivity characteristics that are suitable for underwater and other applications. For example, velocity and pressure sensors may be constructed using a layer of piezoelectric PBLG material according to the teachings of the present disclosure. Further, fabrication techniques are disclosed herein that provide for a simplified process to manufacture a PBLG-based microphone.

The fabrication of thermally stable, piezoelectric nanofibers by electrospinning PBLG, a synthetic poly(amino acid), with a stable alpha helical conformation was recently described in the article entitled "Permanent Polarity and Piezoelectricity of Electrospun alpha-Helical Poly(alpha-Amino Acid) Fibers," by Farrar et al., Adv. Mater. 23, 3954-3958 (2011), the entirety of which is hereby incorporated by reference. This helical polymer contains a large electrical dipole due to a collection of hydrogen bonds pre-aligned in the direction of the helical axes. When the polymer solution is subjected to electrospinning condition, the dipole of the PBLG interacts with the external electric field, and nanofibers are formed with individual PBLG helices poled in the direction of the fiber. This process created fibers with permanent polarity as evidenced by second harmonic generation microscopy and electric field-induced fiber bending experiment. After the electrospinning process, the macroscopic dipoles of helical PBLG molecules are tightly held together by intermolecular forces which are reported to be stable up to 130° C. in the solid state. The fibers showed relatively large piezoelectricity. In particular, the fibers demonstrated a compressive piezoelectric coefficient ($d_{33}$) of 20 pC/N and shear piezoelectric coefficient ($d_{14}$) of −1 pC/N. The piezoelectricity was stable at 100° C. for more than 24 hours, which is potentially one of the highest thermally stable piezoelectric coefficients reported for poled polymers. The fibers can be hot pressed at 100° C. into continuous film without loss of piezoelectricity.

As discovered by the inventors, the thermal stability, strong permanent dipole, and ease of fabrication make PBLG-based piezoelectric fibers and film an excellent candidate for simple planar piezoelectric transducers, especially for potential use as underwater microphones and vector sensors. Both the flat frequency response of a pressure microphone and a high sensitivity of velocity microphone are critical for making a vector sensor. As highlighted in further detail below, velocity and pressure microphones were fabricated by the present inventors using compressed electrospun PBLG nanofibers. The frequency response of a PBLG-based pressure microphone and the beam pattern of a PBLG-based velocity microphone were also determined, allowing comparisons to be made with commercial B&K microphones.

Electrospinning PBLG Fibers:

According to some embodiments, a custom electro spinning setup may be constructed to perform electrospinning on a solution of PBLG fibers. In general, electrospinning operates by applying a voltage to a solution to extract the fibers from the solution. The setup may include a syringe pump (e.g., such as those available from KD Scientific Inc.™, Holliston, Mass.), a power supply (e.g., such as those available from Gamma High Voltage Research™, Ormond Beach, Fla.) and a rotating mandrel. In one embodiment, a 1 mL TB syringe (e.g., such as those available from Beckton Dickinson Inc.™, Franklin Lakes, N.J.) may be used with a 0.5 inch, 27 G needle (e.g., such as a BD PrecisionGlide™ needle) loaded with a PBLG solution. For example, the PBLG solution used in the syringe pump has a molecular weight of approximately 162,900, 100 mg/mL in dichloromethane.

Using the above-described setup, electrospinning may be conducted by applying approximately −12 kV between the needle tip and the grounded rotating mandrel spinning at approximately 2,500 rpm and wrapped with aluminum foil target. In some embodiments, a distance between the needle and mandrel target may be approximately 5 cm with a syringe pump flow rate of approximately 2 mL/hr. As a result of the electrospinning process, directionally aligned PBLG fibers are formed on the aluminum foil target at the rotating mandrel.

PBLG Film Fabrication:

Upon performance of the electrospinning process highlighted above, a film of directionally aligned PBLG fibers may be peeled from the aluminum foil target of the spinning mandrel. In one embodiment, the resulting film has a thickness of approximately 15 μm.

In various embodiments, a film of PBLG fibers isolated via electrospinning may be hot pressed to form a hot pressed PBLG ("HPPBLG") film using a hot press machine, such as a G30H-15-BP press available from Wabash Presses™, Wabash, Ind. In one embodiment, approximately 1,000 lb of stress may be applied for approximately 30 minutes at approximately 100° C. Other stresses may be applied at different temperatures for different amounts of time, in other embodiments.

In some embodiments, a pressed film of PBLG fibers may be cut (e.g., to form a diaphragm having a desired size and shape). For example, a PBLG film having an approximate thickness of 15 μm may be cut along the shear direction at approximately 45° relative to the fiber direction. The top and bottom surfaces of the cut film may also be coated with evaporated aluminum. The coated film may then be adhered or otherwise coupled to a relatively stiff material, such as a polyester film. For example, a 15 μm thick PBLG film may be glued to a biaxially-oriented polyethylene terephthalate (BoPET) film, commonly known as Mylar™, to form the diaphragm of the microphone. In one embodiment, a double layer film diaphragm may be constructed by gluing two of the PBLG films together. As will be appreciated, a diaphragm may be constructed using any number of PBLG film layers, in other embodiments. Adhesion of PBLG layers may be accomplished using a low viscosity epoxy, such as Spurrs™ low viscosity epoxy available from Polysciences Inc.™, Warrington, Pa., or any other adhesion mechanism.

Another method of construction includes using two layers of HPPBLG, in a manner similar to those described above, where the second hot pressed layer is oriented 90 degrees relative to the first layer, thus eliminating the need for a polyester film. The two HPPBLG can be in either series or parallel, in various embodiments. Another rendering includes two layers of HPPBLG on opposite sides of the polyester film, in a further embodiment.

Microphone Design:

A PBLG-based diaphragm constructed using the techniques disclosed above may be used to construct a microphone/sensor. Any number of different types of microphones may be constructed. For example, a PBLG-based diaphragm may be used to construct a velocity or pressure sensor, in various embodiments.

Figure 1B:
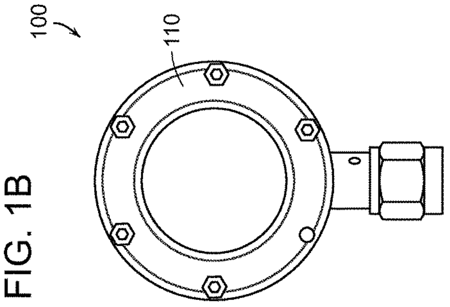
FIG. 1B is a front view of the sensor of FIG. 1A.
Figure 1C:
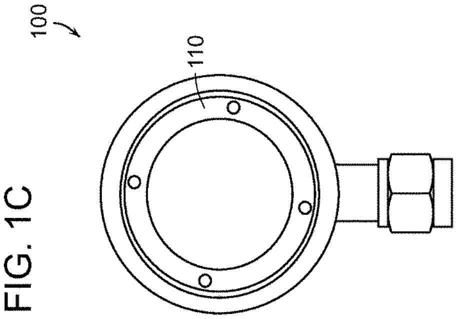
FIG. 1C is a rear view of the sensor of FIGS. 1A-1B.

As shown in FIGS. 1A-1C, a PBLG-based sensor 100 may be constructed by suspending a PBLG-based diaphragm within a cylindrical chamber. FIG. 1A is a side view of the PBLG-based sensor 100; FIG. 1B is a front view of the PBLG-based sensor 100; and FIG. 1C is a rear view of the PBLG-based sensor 100. Actual dimensions for the constructed sensor 100 may include, approximately, a diameter of 2.54 cm and a height of 1.7 cm, though these dimensions may vary, as would be understood by a person of ordinary skill in the art. In general, a cylindrical chamber 110 of at least 10 mm diameter and 15 mm height is needed to obtain flat frequency response and high gain, though these dimensions may vary, as well, as would be understood by a person of ordinary skill in the art. As shown in FIGS. 1A-1C, the PBLG-based diaphragm may be suspended within the top open ring of a microphone holder inside the cylindrical chamber 110. In one embodiment, a velocity sensor/microphone may be constructed using a chamber having an open backside. In another embodiment, a pressure sensor/microphone may be constructed using a chamber having a completely sealed backside.

To achieve high signal to noise ratio, a piezoelectric microphone may be built with materials having relative large capacitances and high piezoelectric coefficients. Typically, a tradeoff exists between these values in electrospun PBLG films. For example, electrospun PBLG fibers may demonstrate the highest piezoelectric coefficient when deformed in the direction of the fiber axes (i.e., $d_{33}$ mode), which is also the direction of the poled dipoles. This mode, however, also results in extremely small capacitances in the direction of the fibers, making this mode unsuitable for microphone applications. Compressing PBLG fibers into a thin film using the techniques herein may produce a relatively large capacitance (e.g., approximately 150 pF).

In some embodiments, a compressed PBLG film's $d_{14}$ mode or $d_{31}$ may be used for microphone construction. However, in some implementations, the shear piezoelectric coefficient $d_{14}$ may be approximately −1 pC/N, which is an order of magnitude higher than that of the $d_{31}$ mode. Thus, as described above, the poled PBLG film may be cut at an angle of approximately 45° relative to the fiber direction, as described above, and glued to a stiff film to form a diaphragm structure.

Test Setup:

A custom-made microphone test setup was constructed using a small loud speaker having an approximate diameter of 10 cm, a computer running Audacity™ software, a SRS 560™ preamplifier available from Stanford Research Systems Inc.™, and a B&K Dual Microphone Supply 5935™ available from B&K Inc.™, Naerum, Denmark. The frequency responses of the PBLG microphones were tested using this setup in a semi-anechoic chamber where the microphones were set 1 m away from the loud speaker. To calibrate the system, a standard B&K microphone (0.5") was used at the same location as the PBLG microphones. During the measurement, the software generated sound signals in discrete frequencies from 200 Hz to 10 kHz. The electrical signals detected by the PBLG microphones and B&K microphone were then fed to the SRS 560 and B&K 5935 preamplifiers respectively, and recorded by the computer. Background noise from the semi-anechoic chamber was removed by averaging 200 adjacent data points.

Pressure Microphone—Test Results:

In a piezoelectric diaphragm microphone, the open-circuit voltage from the piezoelectric film is given by:

$$V_g = \frac{Q_p}{C_p} \tag{1}$$

where $V_g$ is the open circuit voltage in volts, $Q_p$ is the charge generated by piezoelectric plate, and $C_p$ is the capacitance of the piezoelectric plate.

Optimization of a piezoelectric diaphragm that includes a piezoelectric plate and a base plate for transducer application may be performed as follows. The charge generated in the piezoelectric plate can be given by:

$$Q_p = \frac{kd_{31}P_m}{D} \tag{2}$$

where k is a parameter related to the Young's modulus, thickness of piezoelectric plate and base plate; $P_m$ is the sound pressure; $d_{31}$ is the piezoelectric coefficient; and D is the combined flexural rigidity of the piezoelectric plate and the base plate. This expression can be also written in $d_{14}$ mode as follows:

$$V_g = \frac{kd_{14}p_m}{DC_p} \tag{3}$$

From Eq. 3, it follows that the output voltage from the microphone is independent of frequency and is proportional to the piezoelectric coefficient of piezoelectric material and diaphragm structure. During testing, it was discovered that even a slight change in the film condition (e.g., due to wrinkles and thickness variation) can affect the resonance frequency of microphone devices. Accordingly, the stiffness of the PBLG-based diaphragm may be adjusted by adhering the PBLG film to a stiff material. For example, in one embodiment, the PBLG film may be glued to a layer of Mylar film, to control the stiffness of the PBLG samples.

Figure 2:
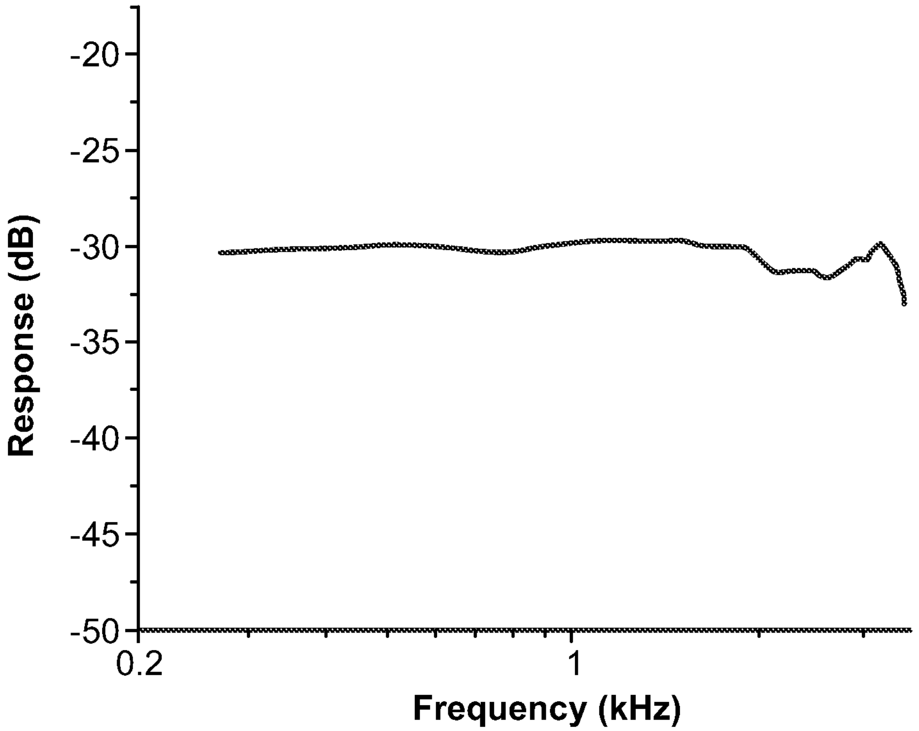
FIG. 2 is an illustrative frequency response plot for a PBLG-based pressure microphone.

FIG. 2 illustrates the frequency response of a PBLG-based pressure microphone constructed using the techniques herein. As shown, the microphone demonstrated a flat frequency (+/−3 dB) from 200 Hz to 4 kHz, which is consistent with the theoretical expectation from Eq. 3 above. When compared to a B&K 0.5 inch calibrated microphone, the PBLG microphone has −30 dB lower sensitivity. This is mainly because of the relatively low $d_{14}$ piezoelectric coefficient (−1 pC/N) of the PBLG film as compared to the high piezoelectric coefficient of LDPP electret polymers (>150 pC/N). However, due to PBLG's remarkably stable dipoles, the PBLG-based microphone is thermally stable and can withstand heat up to 100° C., while LDPP microphone loses its function around 65° C. In addition, the simple planar structure of the PBLG-based microphone design makes the microphone fabrication process extremely simple, while the microphone's insensitivity against static pressure make it ideal for under water use. All of these factors make the PBLG-based microphone disclosed herein a very unique transducer which can potentially be utilized in harsh environmental conditions.

Velocity Microphone—Test Results:

In general, a velocity microphone detects the phase difference of impinging sound waves between the two sides of microphone chamber. The equation for velocity microphone is shown as follows:

$$\Delta p = 2P_m(\cos(\omega t)\left(\sin\frac{kl\cos\theta}{2}\right) \tag{4}$$

where Δp and l are the sound pressure difference and the sound path length from the front to the back of microphone chamber, respectively; $P_m$ is the amplitude of impinging sound pressure; ω is the frequency; and θ is the angle between the incident sound direction and the direction normal to the plane of microphone sample. The main requirement for a velocity, microphone is the directivity, which is the frequency response of microphone that varies in response to change in the impinging sound direction. From Eq. 4, it can be seen that the frequency response of velocity microphone should be a cosine function of incident acoustic pressure. So the minimum and maximum frequency response must be achieved at 90 degree and 0/180 degree, respectively.

Figure 3A:
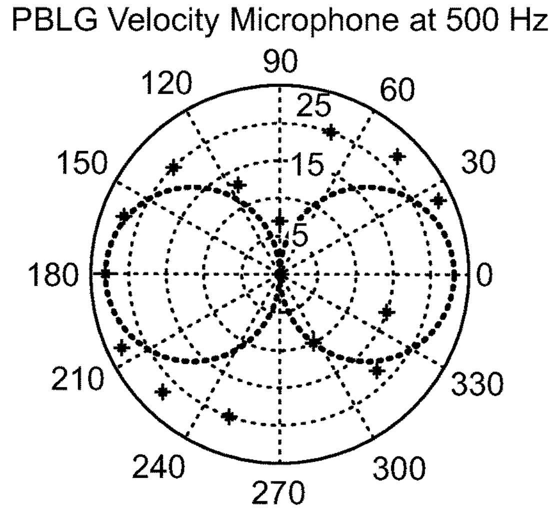
FIG. 3A is an illustrative directional response of a PBLG-based velocity microphone at 500 Hz.
Figure 3B:
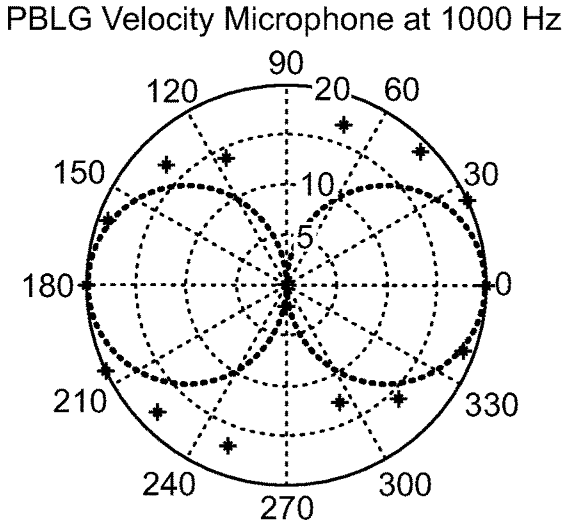
FIG. 3B is an illustrative directional response of a PBLG-based velocity microphone at 1,000 Hz.
Figure 3C:
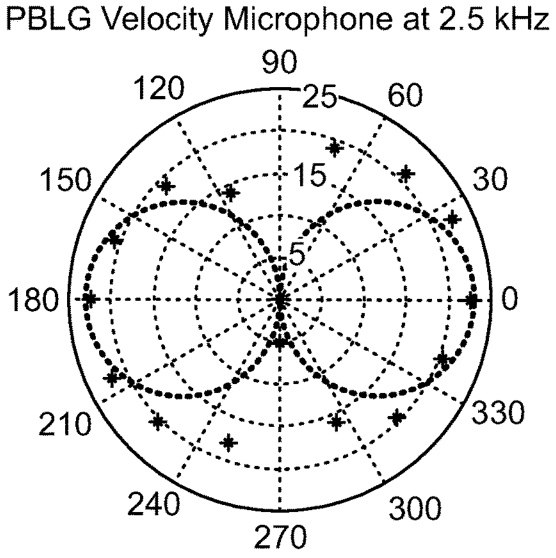
FIG. 3C is an illustrative directional response of a PBLG-based velocity microphone at 2.5 kHz.

The directional characteristics of a PBLG velocity microphone constructed using the techniques herein were measured at three different frequencies (e.g., 500 Hz, 1 kHz, and 2.5 kHz, respectively), as illustrated in FIGS. 3A-3C. In particular, the directional characteristics shown were measured using the acoustic measurement setup discussed above where the facing angles between the microphone and the speaker were varied from 0° to 360°. The output signal at 0° was set to 0 dB (baseline) and the values at other angles were determined relative to the 0° value. As shown in FIGS. 3A-3C, the solid line drawing is a sine wave fitting curve and the experimental results are plotted at individual facing angles of 0°, 25°, 45°, 70°, 90°, 115° and then the other side of the lobe at identical facing angles. The resulting beam pattern is similar to the one from commercially available velocity microphones. The maximum and minimum responses are detected at 0° and 90° facing angle, respectively which is consistent with the theoretical expectation from Eq. 4.

The sensitivity of a velocity microphone is often one of the critical parameters for the design of vector sensors. The PBLG velocity microphone constructed using the techniques herein shows approximately a 30 dB difference between the sound waves impinging from two perpendicular directions, which meets the requirement for a velocity microphone. The results clearly show that the PBLG microphone is a true velocity microphone, and that it can be used for measuring the particle velocity of sound wave and for detecting the direction of sound wave by functioning as a vector sensor. Additionally, the similar chamber design for both the velocity microphone and the pressure microphone, according to various embodiments, makes the disclosed PBLG-based microphone easy to integrate into a vector sensor.

Double Layer Pressure Microphones—Test Results:

Microphones comprised of multilayer films typically show higher sensitivity compared to monolayer system because of improvement in capacitance and mechanical strength. In one embodiment, a double layer pressure microphone may be constructed by laminating two hot pressed PBLG layers using a low viscosity epoxy. The observed frequency response of a double layer PBLG microphone constructed in this manner is illustrated in FIG. 4.

Figure 4:
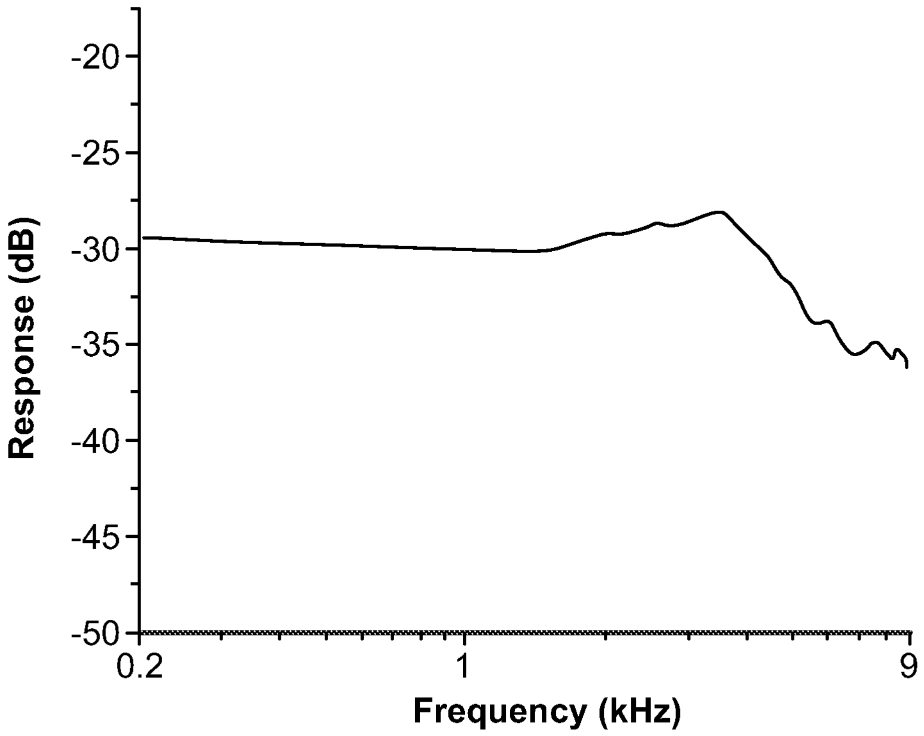
FIG. 4 is an illustrative frequency response plot for a double layer PBLG-based microphone.

As shown in FIG. 4, the sensitivity of a PBLG pressure microphone may be improved by 3 dB at 1 kHz (i.e., from −30 dB shown in FIG. 2 to −27 dB), through the use of a double layer. Thus, the experimental result is consistent with the theoretical expectation. This result also proves that the sensitivity of PBLG microphone can be greatly improved by using laminated multilayer samples.

Theoretically, every doubled capacitance should result in 3 dB improvement in the output power of the microphone and any number of PBLG layers may be employed, in various other embodiments. However, damping of the sensitivity is seen starting from 4 kHz, which could be due to the weak mechanical strength of the PBLG diaphragm structure. In some embodiments, this may be resolved by using a thicker support layer (e.g., a thicker Mylar film) to enhance both the mechanical property and the sound sensitivity of the PBLG microphone.

It is to be understood that this disclosure is not limited to particular methods and experimental conditions described, as such methods and conditions may vary. It is also to be understood that the terminology used herein is for the purpose of describing particular embodiments only, and is not intended to be limiting, since the scope of the present disclosure will be limited only by the appended claims.

Unless defined otherwise, all technical and scientific terms used herein have the same meaning as commonly understood by one of ordinary skill in the art to which this invention belongs. As used herein, the terms "about" and "approximately," when used in reference to a particular recited numerical value or range of values, means that the value may vary from the recited value by no more than 1%. For example, as used herein, the expression "about 100" includes 99 and 101 and all values in between (e.g., 99.1, 99.2, 99.3, 99.4, etc.).

Although any methods and materials similar or equivalent to those described herein can be used in the practice or testing of the present invention, the preferred methods and materials are now described. All publications mentioned herein are incorporated herein by reference in their entirety. Similarly, all references cited herein, whether in print, electronic, computer readable storage media or other form, are expressly incorporated by reference in their entirety, including but not limited to, abstracts, articles, journals, publications, texts, treatises, technical data sheets, internet web sites, databases, patents, patent applications, and patent publications.

A number of embodiments of the disclosure have been described. Nevertheless, it will be understood that various modifications may be made without departing from the spirit and scope of the disclosure. Accordingly, other embodiments are within the scope of the following claims.

What is claimed:

1. A planar microphone comprising:

a cylindrical chamber;

a polyester film;

a first piezoelectric, hot pressed poly (γ-benzyl-α,L-glutamate) ("HPPBLG") layer;

an aluminum coating for the first HPPBLG layer;

a second piezoelectric, HPPBLG layer; and an aluminum coating for the second HPPBLG layer, wherein top and bottom surfaces of the first HPPBLG layer and the second HPPBLG layer, respectively, are coated with aluminum, the aluminum-coated first HPPBLG layer and the aluminum-coated second HPPBLG layer are adhered to opposite sides of the polyester film, and the aluminum-coated first HPPBLG layer, the aluminum-coated second HPPBLG layer, and the polyester film are mounted within the cylindrical chamber.

2. The microphone of claim 1, wherein the polyester film comprises biaxially-oriented polyethylene terephthalate (BoPET).

3. The microphone of claim 1, wherein the polyester film has a thickness of approximately 25 μm.

4. The microphone of claim 1, wherein the first HPPBLG layer or the second HPPBLG layer is cut at an angle of approximately 45° relative to a direction of fiber in the first HPPBLG layer or the second HPPBLG layer.

5. The microphone of claim 1, wherein the first HPPBLG layer or the second HPPBLG layer comprises two or more coupled HPPBLG films.

6. The microphone of claim 5, wherein the HPPBLG films are coupled using a low viscosity epoxy.

7. The microphone of claim 1, wherein the aluminum-coated first HPPBLG layer or the aluminum-coated second HPPBLG layer is coupled to the polyester film using an adhesive.

8. The microphone of claim 1, wherein the first HPPBLG layer or the second HPPBLG layer has a d14 piezoelectric coefficient $d_{14}$ of approximately −1 pC/N.

9. A method of manufacturing a planar microphone comprising:

fabricating a film of first poly (γ-benzyl-α,L-glutamate) ("PBLG") fibers, wherein the PBLG fibers are directionally aligned;

applying a hot press to the film of first PBLG fibers;

cutting the hot pressed film of first PBLG fibers at approximately 45° relative to the directional alignment of the first PBLG fibers;

coating the cut film of first PBLG fibers with aluminum;

adhering the aluminum coated film of first PBLG fibers to a polyester film;

fabricating a film of second poly (γ-benzyl-α,L-glutamate) ("PBLG") fibers, wherein the PBLG fibers are directionally aligned;

applying the hot press to the film of second PBLG fibers;

cutting the hot pressed film of second PBLG fibers at approximately 45° relative to the directional alignment of the second PBLG fibers;

coating the cut film of second PBLG fibers with aluminum;

adhering the aluminum-coated film of second PBLG fiber to the polyester film; and mounting the aluminum-coated film of first PBLG fibers, the aluminum-coated film of second PBLG fibers, and the polyester film within the cylindrical chamber, wherein top and bottom surfaces of the cut film of first PBLG fibers and the cut film of second PBLG fibers, respectively, are coated with aluminum, and the aluminum-coated film of first PBLG fiber and the aluminum-coated film of second PBLG fibers are adhered to opposite sides of the polyester film.

10. The method of claim 9, wherein applying the hot press to the first or second film of PBLG fibers comprises:

applying a stress of approximately 1,000 pounds for approximately 30 minutes at approximately 100° C.

11. The method of claim 9, wherein fabricating the first or second film of PBLG fibers comprises:

loading a syringe with a PBLG solution;

applying a voltage between a tip of the syringe and a grounded, rotating mandrel wrapped with an aluminum fool target;

peeling the first or second film of PBLG fibers from the aluminum foil target.

12. The method as in claim 11, wherein the mandrel is rotated at approximately 2,500 rotations per minute when the voltage is applied.

13. The method as in claim 11, wherein the voltage is approximately −12 kV.

14. The method as in claim 11, wherein the distance between the syringe and the mandrel is approximately 5 cm.

15. The method as in claim 11, wherein the syringe has a flow rate of approximately 2 mL/hr.

16. The method as in claim 9, wherein the polyester film comprises a biaxially-oriented polyethylene terephthalate ("BoPET") film.

17. The method as in claim 16, wherein the BoPET film has a thickness of approximately 25 μm.

18. The method as in claim 17, wherein the aluminum coated film of first PBLG fibers or the aluminum-coated film of second PBLG fibers is adhered to the BoPET film using a low viscosity epoxy.

19. The method as in claim 9, wherein the cylindrical chamber is approximately 2.45 cm in diameter and 1.7 cm in height.

20. The method as in claim 9, wherein the cylindrical chamber comprises an open backside.

21. The method as in claim 9, wherein the cylindrical chamber comprises a sealed backside.

22. A sensor comprising:

a cylindrical chamber;

a first aluminum coated, piezoelectric poly (γ-benzyl-α,L-glutamate) ("PBLG") layer mounted within the cylindrical chamber; and a second aluminum-coated, piezoelectric PBLG layer mounted within the cylindrical chamber, wherein top and bottom surfaces of the first aluminum-coated PBLG layer and the second aluminum-coated PBLG layer, respectively, are coated with aluminum, and the first aluminum-coated PBLG layer and the second aluminum-coated PBLG layer are adhered to opposite sides of a polyester film.

23. The sensor of claim 22, wherein the cylindrical chamber comprises an open backside.

24. The sensor of claim 23, wherein the cylindrical chamber comprise a sealed backside.

25. The sensor of claim 22, wherein the first or second PBLG layer has a $d_{14}$ piezoelectric coefficient d14 of approximately −1 pC/N.

26. The sensor of claim 22, wherein the first or second PBLG layer comprises two hot pressed PBLG ("HPPBLG") layers.

27. The sensor of claim 26, wherein the two HPPBLG layers are connected in series.

28. The sensor of claim 26, wherein the two HPPBLG layers are connected in parallel.

29. The sensor of claim 26, wherein one of the HPPBLG layers is oriented approximately ninety degrees relative to the other HPPBLG layer.

30. A method of manufacturing a planar microphone comprising:

fabricating first and second films of poly (γ-benzyl-α,L-glutamate) ("PBLG") fibers, wherein the PBLG fibers are directionally aligned;

applying a hot press to the first and second films of PBLG fibers to form first and second hot pressed PBLG ("HPPBLG") films;

orienting the first HPPBLG film at approximately ninety degrees relative to of the second HPPBLG film;

coating top and bottom surfaces of the first and second HPPBLG films, respectively, with aluminum;

adhering a polyester film to the aluminum-coated first and second HPPBLG films, wherein the aluminum-coated first HPPBLG film and the aluminum-coated second HPPBLG film are adhered to opposite sides of the polyester film; and mounting the aluminum-coated first and second HPPBLG films and the polyester film within a cylindrical chamber.

* * * * *